(12) United States Patent
Hartner et al.

(10) Patent No.: US 12,368,111 B2
(45) Date of Patent: Jul. 22, 2025

(54) SEMICONDUCTOR APPARATUSES WITH RADIO-FREQUENCY LINE ELEMENTS, AND ASSOCIATED MANUFACTURING METHODS

(71) Applicant: Infineon Technologies AG, Neubiberg (DE)

(72) Inventors: Walter Hartner, Bad Abbach-Peissing (DE); Christian Geissler, Teugn (DE); Thomas Kilger, Regenstauf (DE); Johannes Lodermeyer, Kinding (DE); Franz-Xaver Muehlbauer, Rimbach (DE); Martin Richard Niessner, Munich (DE); Claus Waechter, Sinzing (DE)

(73) Assignee: Infineon Technologies AG, Neubiberg (DE)

( * ) Notice: Subject to any disclaimer, the term of this patent is extended or adjusted under 35 U.S.C. 154(b) by 759 days.

(21) Appl. No.: 16/227,427

(22) Filed: Dec. 20, 2018

(65) Prior Publication Data

US 2019/0198455 A1     Jun. 27, 2019

(30) Foreign Application Priority Data

Dec. 22, 2017 (DE) .......................... 102017223689.2

(51) Int. Cl.
    *H01L 23/00*     (2006.01)
    *H01L 21/56*     (2006.01)
    (Continued)

(52) U.S. Cl.
    CPC .......... *H01L 23/562* (2013.01); *H01L 21/563* (2013.01); *H01L 23/3157* (2013.01);
    (Continued)

(58) Field of Classification Search
    CPC ............... H01L 23/562; H01L 23/3157; H01L 23/3185; H01L 23/66; H01L 21/563;
    (Continued)

(56) References Cited

U.S. PATENT DOCUMENTS

| | | | |
|---|---|---|---|
| 5,107,231 A * | 4/1992 | Knox | .................... H01P 5/1022 333/239 |
| 9,648,725 B2 | 5/2017 | Suzuki | |

(Continued)

FOREIGN PATENT DOCUMENTS

| | | |
|---|---|---|
| CN | 102144289 A | 8/2011 |
| DE | 102009044967 A1 | 5/2010 |

(Continued)

OTHER PUBLICATIONS

Merriam-Webster-OnLine Dictionary Definitions of "on." No Date!*
Merriam-Webster-OnLine Dictionary Definitions of "inside." No Date!*

*Primary Examiner* — Nathan W Ha
(74) *Attorney, Agent, or Firm* — Harrity & Harrity, LLP (57) ABSTRACT

A semiconductor apparatus comprises: a circuit board; a semiconductor package having a main surface, wherein the semiconductor package is arranged on the circuit board and the main surface faces the circuit board; a radio-frequency line element of the semiconductor package, which radio-frequency line element is arranged on the main surface or inside the semiconductor package, wherein the radio-frequency line element is designed to transmit a signal at a frequency of greater than 10 GHz; and an underfiller material arranged between the circuit board and the semiconductor package, wherein the radio-frequency line element and the underfiller material do not overlap in an orthogonal projection onto the main surface.

20 Claims, 8 Drawing Sheets

(51) Int. Cl.
*H01L 23/31* (2006.01)
*H01L 23/66* (2006.01)
*H01Q 1/22* (2006.01)

(52) U.S. Cl.
CPC .......... *H01L 23/3185* (2013.01); *H01L 23/66* (2013.01); *H01Q 1/2283* (2013.01); *H01L 2223/6677* (2013.01)

(58) Field of Classification Search
CPC . H01L 2224/73204; H01L 2224/32225; H01L 2223/6605; H01L 2223/6677; H01L 2224/16227; H01L 2224/16225; H01L 2924/00; H01Q 1/2283; H05K 1/0243; H05K 3/3436; H05K 2201/09909; H05K 2201/10977
USPC ........................................................ 257/664
See application file for complete search history.

(56) References Cited

U.S. PATENT DOCUMENTS

| | | |
|---|---|---|
| 10,121,751 B2 | 11/2018 | Lachner et al. |
| 2002/0111423 A1 | 8/2002 | Paik et al. |
| 2004/0063240 A1* | 4/2004 | Madrid ............. H01L 23/49562 257/E23.044 |
| 2004/0140550 A1 | 7/2004 | Yoshida |
| 2005/0189641 A1 | 9/2005 | Tao et al. |
| 2006/0003205 A1 | 1/2006 | Yoshida et al. |
| 2010/0078779 A1* | 4/2010 | Barth .................... H01L 23/552 257/659 |
| 2012/0171814 A1* | 7/2012 | Choi ................... H01L 23/5226 257/E21.504 |
| 2015/0097633 A1 | 4/2015 | Devries et al. |
| 2018/0131064 A1* | 5/2018 | Nummerdor, Jr. ...... H01P 1/205 |

FOREIGN PATENT DOCUMENTS

| | | | | |
|---|---|---|---|---|
| DE | 102010001407 A1 | | 9/2010 | |
| DE | 102017223689 A1 * | | 6/2019 | ........... H01L 21/563 |
| JP | 2008060592 A | | 3/2008 | |
| JP | 2008153482 A | * | 7/2008 | |
| JP | 2015185746 A | * | 10/2015 | |
| WO | WO 2006/019336 A2 | | 2/2006 | |
| WO | 2016085561 A1 | | 6/2016 | |
| WO | WO-201608561 | * | 6/2016 | |

* cited by examiner

SEMICONDUCTOR APPARATUSES WITH RADIO-FREQUENCY LINE ELEMENTS, AND ASSOCIATED MANUFACTURING METHODS

RELATED APPLICATION

This application claims priority under 35 U.S.C. § 119 to German Patent Application No. 102017223689.2, filed on Dec. 22, 2017 the content of which is incorporated by reference herein in its entirety.

TECHNICAL FIELD

The present disclosure relates in general to semiconductor technology. In particular, the disclosure relates to semiconductor apparatuses with radio-frequency line elements and to methods for manufacturing such semiconductor apparatuses.

BACKGROUND

Radio-frequency applications, such as e.g. radar applications, can encompass semiconductor packages that have their connection elements soldered to a circuit board. In the course of temperature cycling on board (TCoB), the ability of the solder joints to withstand mechanical stress triggered by temperature cycles is tested. A continual increase in the scale of integration during the development of new products leads to an increase in the package size and hence to reduced TCoB performance by the semiconductor apparatuses manufactured. The manufacturers of semiconductor apparatuses are therefore striving to provide improved semiconductor apparatuses having improved TCoB performance and methods for manufacturing such semiconductor apparatuses.

BRIEF DESCRIPTION

Various aspects relate to a semiconductor apparatus, comprising: a circuit board; a semiconductor package having a main surface, wherein the semiconductor package is arranged on the circuit board and the main surface faces the circuit board; a radio-frequency line element of the semiconductor package, which radio-frequency line element is arranged on the main surface or inside the semiconductor package, wherein the radio-frequency line element is designed to transmit a signal at a frequency of greater than 10 GHz; and an underfiller material arranged between the circuit board and the semiconductor package, wherein the radio-frequency line element and the underfiller material do not overlap in an orthogonal projection onto the main surface.

Various aspects relate to a semiconductor apparatus, comprising: a semiconductor package having a main surface; a radio-frequency line element of the semiconductor package, which radio-frequency line element is arranged on the main surface or inside the semiconductor package, wherein the radio-frequency line element is designed to provide a signal at a frequency of greater than 10 GHz to a circuit board; and a protective structure arranged on the main surface of the semiconductor package, wherein the protective structure and a region of the main surface that is designed to be covered by an underfiller material between the main surface and the circuit board when the semiconductor package is arranged on the circuit board do not overlap in an orthogonal projection onto the main surface.

Various aspects relate to a method for manufacturing a semiconductor apparatus, wherein the method comprises: arranging a semiconductor package having a main surface on a circuit board; and depositing an underfiller material on the circuit board, wherein the main surface faces the circuit board, a radio-frequency line element of the semiconductor package is arranged on the main surface or inside the semiconductor package, the radio-frequency line element being designed to transmit a signal at a frequency of greater than 10 GHz, and the underfiller material is arranged between the circuit board and the semiconductor package, the radio-frequency line element and the underfiller material not overlapping in an orthogonal projection onto the main surface.

Various aspects relate to a semiconductor apparatus, comprising: a circuit board; a semiconductor package having a main surface, wherein the semiconductor package is arranged on the circuit board and the main surface faces the circuit board; a radio-frequency line element of the semiconductor package, which radio-frequency line element is arranged on the main surface or inside the semiconductor package, wherein the radio-frequency line element is designed to conduct a signal at a frequency of greater than 10 GHz; and an underfiller material arranged between the circuit board and the semiconductor package and covering all of the main surface, wherein the underfiller material has a dielectric constant of less than 2.5.

BRIEF DESCRIPTION OF THE DRAWINGS

The accompanying drawings serve to deepen the understanding of aspects of the present disclosure. The drawings illustrate embodiments and, together with the description, serve to explain the principles of these aspects. The elements of the drawings do not necessarily have to be to scale relative to one another. Identical reference signs denote corresponding similar parts.

FIG. 1 collectively refers to FIGS. 1A and 1B.

FIG. 2 collectively refers to FIGS. 2A and 2B.

FIG. 7 collectively refers to FIGS. 7A-7D, which schematically show views of semiconductor apparatuses 700A-700D having specific layouts according to the disclosure from below. The semiconductor apparatuses 700A-700D contain underfiller materials having specific layouts.

FIG. 8 collectively refers to FIGS. 8A to 8F, which schematically illustrate cross-sectional views from the side and plan views of a method for manufacturing a semiconductor apparatus 800 according to the disclosure. The method of FIG. 8 can be regarded as a more detailed implementation of the method of FIG. 3.

DETAILED DESCRIPTION

The detailed description that follows refers to the accompanying drawings, which, for the purposes of illustration, show specific aspects and embodiments in which the disclosure can be implemented in practical terms. In this context, direction terms such as, for example, "top", "bottom", "front", "back", etc., can be used with reference to the orientation of the figures described. Since the components of the described embodiments can be positioned in different orientations, the direction terms can be used for the purposes of illustration and are in no way limiting. Other aspects can be used and structural or logical changes made without departing from the concept of the present disclosure. That is to say that the detailed description that follows is not intended to be understood as limiting.

The methods described herein and the apparatuses manufactured thereby may encompass one or more semiconductor chips. In general, the semiconductor chips may have integrated circuits, passive electronic components, active electronic components, etc. The integrated circuits can be in the form of integrated logic circuits, analog integrated circuits, integrated hybrid signal circuits, integrated power circuits, etc. In one example, the semiconductor chips can be manufactured from an elementary semiconductor material, for example Si, etc. In a further example, the semiconductor chips can be manufactured from a composite semiconductor material, for example GaN, SiC, SiGe, GaAs, etc.

The semiconductor chips can be at least partially encapsulated by a molding material (or encapsulation material). The resultant apparatus can form a semiconductor package. The semiconductor packages described herein are not restricted to one particular type. By way of example, the semiconductor packages can be wafer-level packages (in particular fan-in wafer-level packages), embedded wafer-level packages (in particular fan-out wafer-level packages), chip-scale packages, ball grid arrays, etc. The molding material may contain at least one of the following: a laminate, an epoxy, a filled epoxy, a fiberglass-filled epoxy, an imide, a thermoplastic, a thermosetting polymer and a polymer mixture. Various techniques can be used for encapsulating components with the encapsulation material, for example at least one of the following: compression molding, injection molding, powder molding, liquid molding, laminating, etc.

The semiconductor packages, or the apparatuses described herein, can operate in a radio-frequency or microwave-frequency range that can, in general, extend from approximately 10 GHz to approximately 300 GHz. By way of example, the semiconductor chips described herein can therefore comprise integrated radio-frequency or microwave circuits operating in a frequency range of greater than 10 GHz. Such microwave circuits can comprise microwave transmitters, microwave receivers, microwave transceivers, microwave sensors or microwave detectors, for example. The apparatuses described herein can be used for radar applications. Radar microwave apparatuses can be used in automotive or industrial applications for distance ascertainment/distance measuring systems, for example. By way of example, automatic vehicle speed regulation systems or vehicle anticollision systems can operate in a microwave-frequency range, e.g. at approximately 24 GHz or 80 GHz.

The semiconductor packages, or the apparatuses described herein, can encompass one or more radio-frequency line elements. In particular, the radio-frequency line elements can be designed to transmit a signal at a frequency of greater than 10 GHz. In one example, a radio-frequency line element can be a radio-frequency signal connection of a semiconductor package. By way of example, the radio-frequency signal connection can be in the form of a connection element made of solder material (e.g. a solder ball, a solder deposit, a solder coating, a solder bead, a solder bump). The radio-frequency signal connection can be consistent with an output connection of the semiconductor package that provides a radio-frequency signal, processed in the integrated circuits of the semiconductor package, at a frequency of greater than 10 GHz to a circuit board. In a further example, a radio-frequency line element can be a radio-frequency signal line. In the apparatuses described herein, radio-frequency signal lines can be arranged on a main surface of a semiconductor package or on a main surface of a circuit board. The radio-frequency signal lines can be designed to transmit radio-frequency signals at a frequency of greater than 10 GHz. In yet a further example, the radio-frequency line element can be an antenna designed to send and/or receive radio-frequency signals at a frequency of greater than 10 GHz.

The methods described herein, or the apparatuses manufactured thereby, can encompass an underfiller material. The underfiller material may in particular be arranged between a circuit board and a semiconductor package arranged on the circuit board. Owing to different coefficients of thermal expansion of the semiconductor chips, of the molding material, of the circuit board and of the connection elements, mechanical stresses initiated by temperature fluctuations can arise between these components. The use of an underfiller material allows mechanical stresses of this kind to be reduced. In particular, the underfiller materials can be epoxy-based underfiller materials. The underfiller materials may in this case be formed from a curable organic matrix, which may have added filler particles. The filler particles can in this instance be chosen specifically, in order to influence the electrical, thermal and mechanical properties of the underfiller material. In one example, use of filler particles made of silicon dioxide can influence the coefficient of thermal expansion or the modulus of elasticity of the underfiller material. In a further example, use of metal particles, such as e.g. silver or copper, can influence the electrical conductivity of the underfiller material. The underfiller materials described herein may in particular have a modulus of elasticity with a value of greater than approximately 8 GPa. Further, the underfiller materials described herein may in particular have a dielectric constant of less than approximately 2.5. In addition, the underfiller materials described herein may in particular have a coefficient of thermal expansion with a value of less than approximately 20 ppm/K.

Figure 1A:
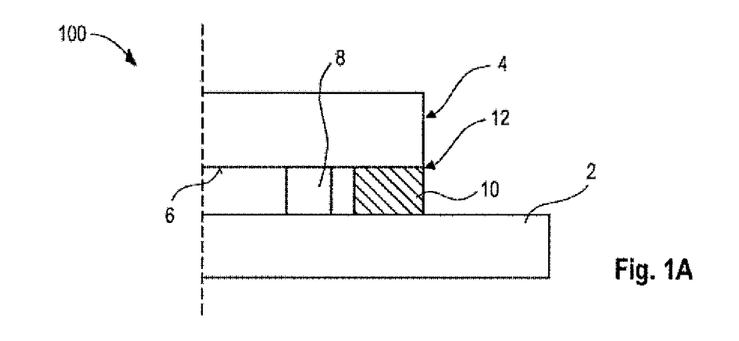
FIG. 1A schematically illustrates a cross-sectional side view of a semiconductor apparatus 100 according to the disclosure having a semiconductor package arranged on a circuit board.
Figure 1B:
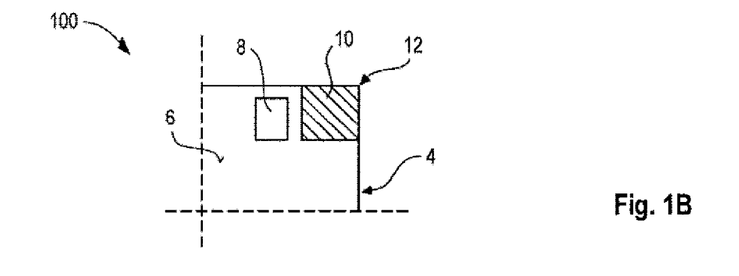
FIG. 1B schematically illustrates a view of the semiconductor package from below.

FIG. 1 collectively refers to FIGS. 1A and 1B, which show different views of a semiconductor apparatus 100 according to the disclosure. The semiconductor apparatus 100 is depicted in a general manner in order to describe aspects of the disclosure in qualitative terms. FIG. 1 shows essential components of the semiconductor apparatus 100, which can also contain further components, not illustrated for the sake of simplicity. For example, the semiconductor apparatus 100 can be extended by any of the aspects described in conjunction with other apparatuses according to the disclosure.

FIG. 1A schematically illustrates a cross-sectional side view of the semiconductor apparatus 100. In the example of FIG. 1, for the sake of simplicity, not all of the semiconductor apparatus 100 is depicted, this being indicated by dashed lines. The semiconductor apparatus 100 contains a circuit board 2 and a semiconductor package 4 having a main surface 6, wherein the semiconductor package 4 is arranged on the circuit board 2 and the main surface 6 faces the circuit board 2. The semiconductor apparatus 100 further encompasses a radio-frequency line element 8 of the semiconductor package 4, which radio-frequency line element is arranged on the main surface 6 or inside the semiconductor package 4, wherein the radio-frequency line element 8 is designed to transmit a signal at a frequency of greater than 10 GHz. In the example of FIG. 1, the radio-frequency line element 8 is arranged on the main surface 6 by way of example. In a further example, the radio-frequency line element 8 may alternatively be arranged inside the semiconductor package 4 or on the main surface of the semiconductor package 4 that is opposite the main surface 6. Further, in the example of FIG. 1, the radio-frequency line element 8 is depicted in rectangular fashion or in cuboid or parallelepipedal fashion. The radio-frequency line element 8 is not restricted to one specific geometric shape, however. In a further example, the radio-frequency line element 8 may also be depicted in circular or spherical fashion, for example.

The semiconductor apparatus 100 further contains an underfiller material 10 arranged between the circuit board 2 and the semiconductor package 4, wherein the radio-frequency line element 8 and the underfiller material 10 do not overlap in an orthogonal projection onto the main surface 6, as can be seen from FIG. 1B. In particular, the radio-frequency line element 8 is accordingly not covered by the underfiller material 10. In the example of FIG. 1, the underfiller material 10 is arranged in a corner region of the main surface 6 between the circuit board 2 and the semiconductor package 4 by way of example. In the example of FIG. 1, the underfiller material 10 covers the corner 12 of the main surface 6 and the lateral edges of the main surface 6 that adjoin the corner 12.

In the examples shown herein, the underfiller material 10 can extend until an interval of at least half of one pitch interval (interspace interval between the connection elements) is reached. By way of example, the pitch interval can be in a range from 500 to 300 microns, the associated minimum intervals between the underfiller material 10 and the radio-frequency line elements 8 being in the range from 250 to 150 microns.

In a further example, the corner 12 of the main surface 6 can remain at least partially not covered by the underfiller material 10. In addition, the underfiller material 10 does not have to cover the lateral edges continuously, but rather intermediate sections can arise in which one or both of the lateral edges remain uncovered. The term "corner region" used herein accordingly does not have to denote a region comprising the corner 12 completely, but rather can more generally specify a region adjoining the corner 12 or (immediately) adjacent to the corner 12.

In the example of FIG. 1, the underfiller material 10 is depicted in rectangular fashion or in cuboid or parallelepipedal fashion. The underfiller material 10 is not restricted to this geometric shape, however. On the basis of the depiction chosen in FIG. 1, the underfiller material 10 is depicted in only a single corner region of the main surface 6. The underfiller material 10 may furthermore alternatively be arranged in multiple corner regions of the main surface 6, on one or more entire or partial lateral edges of the main surface 6, as can also be seen from the examples further below. FIG. 1B schematically illustrates a view of the semiconductor package 4 from below, wherein the main surface 6, the radio-frequency line element 8 and the underfiller material 10 are identifiable. In further example embodiments, the underfiller material can be arranged in an edge region of the semiconductor package, for example in a central region of the edge, as depicted by way of example in FIG. 10.

The use of the underfiller material 10 arranged between the semiconductor package 4 and the circuit board 2 allows mechanical stresses between the components of the semiconductor apparatus 100 to be reduced that can arise during operation or in accordance with the TCoB of the semiconductor apparatus 100 on account of different coefficients of thermal expansion of the components. By way of example, a coefficient of thermal expansion of a semiconductor chip contained in the semiconductor package 4 can be approximately 3 ppm/K, a coefficient of thermal expansion of a molding material contained in the semiconductor package 4 can be approximately 6 ppm/K, and a coefficient of thermal expansion of the circuit board can be approximately 10-15 ppm/K. In this instance, the underfiller material 10 has only minor effects on the radio-frequency performance of the semiconductor apparatus 100, however, since the radio-frequency line element 8 and the underfiller material 10 do not overlap in an orthogonal projection onto the main surface 6, or the radio-frequency line element 8 remains not covered by the underfiller material 10. In the case of the semiconductor apparatus 100, the TCoB performance may accordingly be at an increased level without in this instance having to accept radio-frequency power losses during operation of the semiconductor apparatus 100. In particular, the radio-frequency power losses in the case of the semiconductor apparatus 100 can be lower than in the case of a semiconductor apparatus in which the radio-frequency line element is covered by an underfiller material. This may in particular be the case when the underfiller material covers all of the main surface of the semiconductor package. In example embodiments, there can be provision for all of the radio-frequency line elements of the semiconductor apparatus 100 that transmit a signal at a frequency of 10 GHz or more not to overlap with the underfiller material 10 in an orthogonal projection onto the main surface 6. In further example embodiments, there can be provision for the radio-frequency line elements of the semiconductor apparatus 100 that transmit a signal at a frequency of 10 GHz or more also to be at intervals from the underfiller material 10 (for example of at least half of one pitch interval or a quarter of the pitch interval) in an orthogonal projection onto the main surface 6.

Figure 2A:
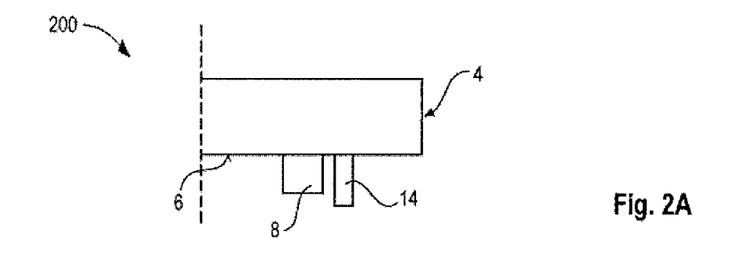
FIG. 2A schematically illustrates a cross-sectional side view of a semiconductor apparatus 200 according to the disclosure.
Figure 2B:
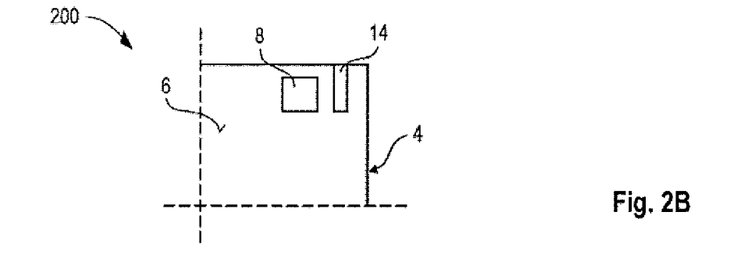
FIG. 2B schematically illustrates a view of the semiconductor apparatus 200 from below.

FIG. 2 collectively refers to FIGS. 2A and 2B, which show different views of a semiconductor apparatus 200 according to the disclosure. The semiconductor apparatus 200 is illustrated in a general manner in order to describe aspects of the disclosure in qualitative terms. FIG. 2 shows essential components of the semiconductor apparatus 200, which can contain further components, not illustrated for the sake of simplicity. For example, the semiconductor apparatus 200 can be extended by any of the aspects described in conjunction with other apparatuses according to the disclosure.

FIG. 2A schematically illustrates a cross-sectional side view of the semiconductor apparatus 200, while FIG. 2B shows a view of the semiconductor apparatus 200 from below. In the example of FIG. 2, for the sake of simplicity, not all of the semiconductor apparatus 200 is depicted, this being indicated by dashed lines. The semiconductor apparatus 200 contains a semiconductor package 4, having a main surface 6, and a radio-frequency line element 8 of the semiconductor package 4, which radio-frequency line element is arranged on the main surface 6 or inside the semiconductor package 4. The radio-frequency line element 8 is designed to provide a signal at a frequency of greater than 10 GHz to a circuit board (not depicted). Further, the semiconductor apparatus 200 encompasses a protective structure 14 arranged on the main surface 6 of the semiconductor package 4, wherein the protective structure 14 and a region of the main surface that is designed to be covered by an underfiller material (not depicted) between the main surface 6 and the circuit board 2 when the semiconductor package 4 is arranged on the circuit board do not overlap in an orthogonal projection onto the main surface 6. In the example of FIG. 2, the protective structure 14 is arranged on the main surface 6 of the semiconductor package 4 between the radio-frequency line element 8 and a corner region of the main surface 6 by way of example, this also being able to be referred to as a corner bond.

The semiconductor package 4 can be similar to the semiconductor package 4 of FIG. 1. In contrast to FIG. 1, the semiconductor package 4 of FIG. 2 additionally contains the protective structure 14. Different examples of the embodiment of the protective structure 14 and associated manufacturing methods are described later on. The semiconductor package 4 can be arranged on a circuit board (not depicted), as depicted in FIG. 1. In such an arrangement, the protective structure 14 can prevent the underfiller material 10 used from covering the radio-frequency line element 8. In one example, the underfiller material 10 can be in an initially liquid state and subsequently cure. The protective structure 14 can in this instance perform a stopper function and prevent the underfiller material 10 from running onto the radio-frequency line element 8.

Figure 3:
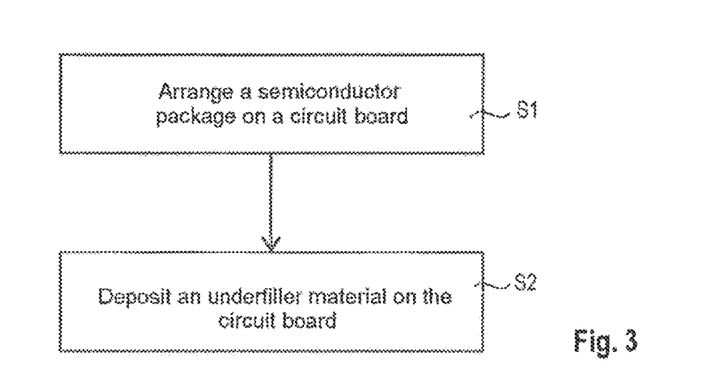
FIG. 3 shows a flowchart of a method for manufacturing a semiconductor apparatus according to the disclosure.

FIG. 3 shows a flowchart of a method for manufacturing a semiconductor apparatus according to the disclosure. The method is illustrated in a general manner in order to describe aspects of the disclosure in qualitative terms. By way of example, the method can be extended by any aspects of the method of FIG. 8. By way of example, the method can be used to produce the semiconductor apparatus 100 of FIG. 1, which means that corresponding reference signs are used below.

In S1, a semiconductor package 4 having a main surface 6 is arranged on a circuit board 2. At S2, an underfiller material 10 is deposited on the circuit board 2. In the method described, the main surface 6 of the semiconductor package 4 faces the circuit board 2. Further, a radio-frequency line element 8 of the semiconductor package 4 is arranged on the main surface 6 or inside the semiconductor package 4, wherein the radio-frequency line element 8 is designed to transmit a signal at a frequency of greater than 10 GHz. In addition, the underfiller material 10 is arranged between the circuit board 2 and the semiconductor package 4, wherein the radio-frequency line element 8 and the underfiller material 10 do not overlap in an orthogonal projection of the main surface 6.

Figure 4:
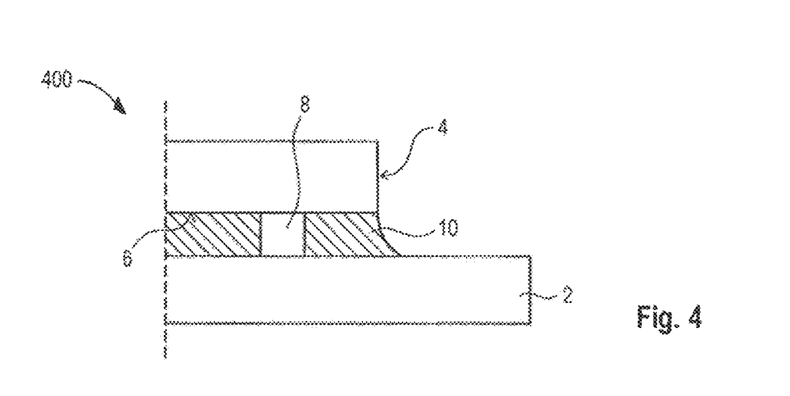
FIG. 4 schematically illustrates a cross-sectional side view of a semiconductor apparatus 400 according to the disclosure having a semiconductor package arranged on a circuit board.

Fig. 4 schematically illustrates a cross-sectional side view of a semiconductor apparatus 400 according to the disclosure. In the example of FIG. 4, for the sake of simplicity, not all of the semiconductor apparatus 400 is depicted, this being indicated by a dashed line. The semiconductor apparatus 400 encompasses to some extent components that have already been described in connection with the preceding figures. The semiconductor apparatus 400 contains a circuit board 2 and a semiconductor package 4 having a main surface 6, wherein the semiconductor package 4 is arranged on the circuit board 2 and the main surface 6 faces the circuit board 2. Further, the semiconductor apparatus 400 contains a radio-frequency line element 8 of the semiconductor package 4, which radio-frequency line element is arranged on the main surface 6 or inside the semiconductor package 4, wherein the radio-frequency line element 8 is designed to conduct a signal at a frequency of greater than 10 GHz. In addition, the semiconductor apparatus 400 encompasses an underfiller material 10 arranged between the circuit board 2 and the semiconductor package 4 and covering all of the main surface 6, wherein the underfiller material 10 has a dielectric constant of less than 2.5.

As already mentioned above, the radio-frequency power of a semiconductor apparatus can be affected when radio-frequency line elements of the semiconductor package are covered by an underfiller material. In the case of the semiconductor apparatus 400 of FIG. 4, the effects of the underfiller material 10 on the radio-frequency performance of the semiconductor apparatus 400 can be reduced by the choice of an underfiller material 10 having a dielectric constant of less than 2.5. Complete coverage of the main surface 6 by the underfiller material 10 can reduce the mechanical stresses that arise during the TCoB. In this context, the coefficient of thermal expansion of the underfiller material 10 can in particular have a value of less than 20 ppm/K.

Figure 5:
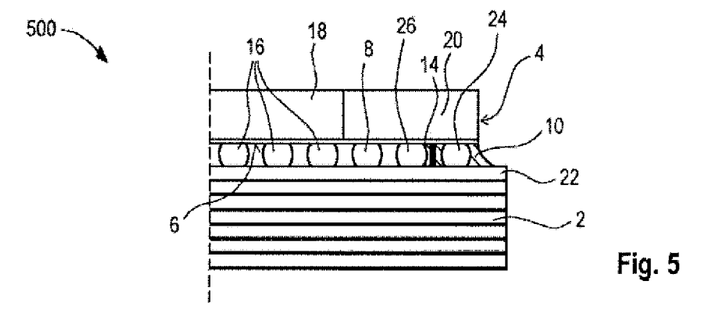
FIG. 5 schematically shows a cross-sectional side view of a semiconductor apparatus 500 according to the disclosure. The semiconductor apparatus 500 contains a semiconductor package arranged on a circuit board. The semiconductor apparatus 500 can be regarded as a more detailed implementation of the semiconductor apparatus 100 of FIG. 1. Further, the semiconductor package can be regarded as a more detailed implementation of the semiconductor apparatus 200 of FIG. 2.

FIG. 5 schematically shows a cross-sectional view from the side of a semiconductor apparatus 500 according to the disclosure. The semiconductor apparatus 500 can be regarded as a more detailed implementation of the semiconductor apparatus 100 of FIG. 1. Further, the semiconductor package 4 shown in FIG. 5 can be regarded as a more detailed implementation of the semiconductor apparatus 200 of FIG. 2. In the example of FIG. 5, for the sake of simplicity, not all of the semiconductor apparatus 500 is depicted, this being indicated by a dashed line.

The semiconductor apparatus 500 contains a semiconductor package 4 arranged on a circuit board 2, wherein an underfiller material 10 is arranged between the semiconductor package 4 and the circuit board 2. The modulus of elasticity of the underfiller material 10 can have a value of greater than 8 GPa. The semiconductor package 4 can encompass one or more semiconductor chips 18 and a molding material 20, wherein the molding material 20 at least partially encapsulates the semiconductor chip 18. In the example of FIG. 5, the molding material 20 covers the lateral faces of the semiconductor chip 18. In a further example, the molding material 20 can additionally cover the top of the semiconductor chip 18. The bottom main surface of the semiconductor chip 18 and the bottom main surface of the molding material 20 can form the main surface of the semiconductor package 4 in coplanar fashion. The circuit board 2 can be a printed circuit board (PCB) or a printed circuit board stack (PCB stack), for example. The topmost layer of the circuit board 2 can be a radio-frequency laminate layer 22, which can be manufactured from a PTFE-based material having a low dielectric constant, for example.

In the example of FIG. 5, the semiconductor package 4 can be mechanically and/or electrically connected to the circuit board 2 by means of connection elements 16. FIG. 5 depicts an example number of six such connection elements 16. The connection elements 16 can be manufactured from a solder material, for example, wherein the semiconductor package 4 is soldered to the circuit board 2. The connection elements 16 can differ in terms of their functionality. One of the connection elements 16 can be a radio-frequency line element 8 arranged on the main surface 6, which radio-frequency line element is designed to transmit a signal at a frequency of greater than 10 GHz, in particular to provide said signal to the circuit board 2. In the example of FIG. 5, the radio-frequency line element 8 may in particular be a radio-frequency signal connection of the semiconductor package 4. The radio-frequency line element 8 and the underfiller material 10 do not overlap in an orthogonal projection onto the main surface 6. The radio-frequency line element 8 is not covered by the underfiller material 10, which means that radio-frequency power losses during operation of the semiconductor apparatus 500 can be reduced.

The semiconductor apparatus 500 can encompass further radio-frequency line elements (not depicted). In one example, these can be one or more further radio-frequency signal connections arranged on the main surface 6 of the semiconductor package 4 that are likewise possibly not covered by the underfiller material 10. In a further example, they can be one or more radio-frequency signal lines (not depicted) that can be arranged on the main surface 6 of the semiconductor package 4 and/or on the top main surface of the circuit board 2. The radio-frequency signal lines can be electrically connected to radio-frequency signal connections and not covered by the underfiller material 10.

A further instance of the connection elements 16 can be a signal connection 24 of the semiconductor package 4 for analog or digital signals that the semiconductor package 4 can provide to the circuit board 2 or receive therefrom. The signal connection 24 is arranged in a corner region of the main surface 6 of the semiconductor package 4 and covered by the underfiller material 10. A further instance of the connection elements 16 can be a ground connection 26 of the semiconductor package 4, which can be arranged on the main surface 6 of the semiconductor package 4 between the signal connection 24 and the radio-frequency line element 8. In the example of FIG. 5, the ground connection 26 is not covered by the underfiller material 10.

One or more of the further connection elements 16 can be further electrical connections of the semiconductor package 4, for example. Alternatively, one or more of the further connection elements 16 may also be redundant connection elements that perform no specific electronic functionality but rather can improve the TCoB performance of the semiconductor apparatus 500 on account of their mechanical connection between the circuit board 2 and the semiconductor package 4.

The semiconductor apparatus 500 can optionally encompass a protective structure 14 arranged between the radio-frequency line element 8 and the underfiller material 10. In particular, the protective structure 14 can be arranged between the signal connection 24 and the ground connection 26. The protective structure 14 can protect or delimit the radio-frequency line element 8 from the underfiller material 10, the underfiller material 10 being able to make contact with the protective structure 14. In the case of an initially liquid underfiller material 10, the protective structure 14 can stop the underfiller material 10 from flowing over the radio-frequency line element 8. The subsequently cured underfiller material 10 can form the shape of a meniscus at the edge of the semiconductor package 4. In a further example, the protective structure 14 can be dispensed with, in which case other methods should be used to ensure that the radio-frequency line element 8 remains not covered by the underfiller material 10. The underfiller material 10 should at most still cover the ground connection 26, so that the radio-frequency line element 8 remains safely not covered by the underfiller material 10.

The protective structure 14 can be manufactured in different ways. The manufacturing steps described below can be used to produce protective structures on individual or already singularized semiconductor packages, but also to produce protective structures in a batch process for multiple or as yet unsingularized semiconductor packages, which can be in the form of an eWLB (embedded wafer level ball grid array) wafer for example.

Figure 9:
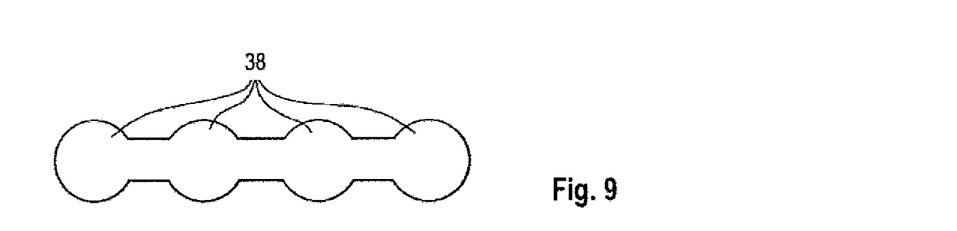
FIG. 9 shows the footprint of multiple interconnected contact pads on a circuit board. The connected contact pads can be used for manufacturing a protective structure.

In one example, the protective structure 14 can be formed by multiple solder balls that have flowed into one another, wherein the solder balls are arranged on multiple interconnected contact pads of the circuit board 2. By way of example, the connected contact pads of the circuit board 2 can have a footprint as shown in FIG. 9 and can be formed from a top copper layer of the circuit board 2. In the example of FIG. 9, an example number of four circular contact pads 38 is shown, which are connected by sections arranged between the contact pads 38. The coherent form of the contact pads means that connection elements made of solder material that are arranged thereon can flow into one another during the soldering process and can form a protective structure 14 in the form of a protective wall. The coherent contact pads of the circuit board 2 may in particular be the ground contact pads of the circuit board 2 that are opposite the ground connections 26.

In a further example, the protective structure 14 can be manufactured by using a 3D jet printing method. The protective structure can be printed onto the main surface 6 of the semiconductor package 4 and can be manufactured from a 3D jet printable material, for example SU8. This requires the needle of the 3D jet printer to be adapted in a manner such that the protective or barrier structure manufactured is narrow enough to fit between the applicable connection elements 16, in particular between the signal connection 24 and the ground connection 26. Further, the height of the protective structure 14 manufactured needs to be matched to the viscosity of an initially liquid underfiller material 10 in order to be able to work as a stopper element.

In a further example, the protective structure 14 can be manufactured using a photolithographic method. The protective structure 14 may therefore be formed by a photosensitive lacquer or a photosensitive adhesive patterned using a photolithographic process. In a first step, a film of the photosensitive material can be deposited, for example by means of spin-on coating, spray coating or dry film lamination. The thickness of the deposited film can be in the region of the thickness of the connection elements 16 in this instance. The diameter of connection elements in the form of solder balls can be in a range from approximately 100 microns to approximately 350 microns, for example. After the depositing, the film can be patterned using lithographic processes. The photolithographic method can be carried out at wafer or panel level before singularization of the semiconductor package 4.

In a further example, the protective structure 14 can be formed by a prefabricated structure arranged at the relevant point on the main surface 6 of the semiconductor package 4. The structure can be a PCB rail, a silicon block or a body made of molding material, for example.

In one example, the prefabricated structure can be arranged at wafer or panel level before singularization of the semiconductor package 4. In this instance, a protective structure can cover multiple as yet unsingularized semiconductor packages. By way of example, a protective structure can be in rectangular form and arranged around the corner regions of four adjoining semiconductor packages having rectangular main surfaces. After singularization of the semiconductor packages, each of the corner regions of the semiconductor packages then encompasses an L-shaped protective structure, as shown in FIG. 6, for example.

In a further example, the protective structure 14 can be manufactured using a batch process, wherein multiple protective structures are first of all manufactured on a separate auxiliary support, for example a glass wafer. The auxiliary support can have a detachable layer arranged on it, for example a DLC (diamond like carbon) layer having a thickness of a few nanometers. In one step, one or more protective structures can first of all be formed on the auxiliary support. For this purpose, a material film can be deposited on the auxiliary support (e.g. using a coating technique or dry film lamination), said material film being able to be patterned using a photolithographic process or using a laser, with the protective structures being formed on the auxiliary support. The protective structures formed can then be dipped into an adhesive material or an adhesive.

In a further step, the auxiliary support can be lined up, the protective structures being positioned on the auxiliary support opposite positions provided for the protective structures on the main surfaces of as yet unsingularized semiconductor packages. At this time, the semiconductor packages may still be in the form of an eWLB (embedded Wafer Level Ball Grid Array) wafer, for example. In a further step, the auxiliary support can be brought into contact with the semiconductor packages under pressure and an increased temperature, the protective structures being attached to the main surface of the semiconductor packages at the points provided, i.e. between radio-frequency line elements and corner regions of the main surfaces of the semiconductor packages, using the previously applied adhesive. Subsequently, the protective structures can be freed, or the auxiliary support can be removed, by virtue of the detachable layer being detached from the auxiliary support, for example using a laser (laser debonding). The method described can be used to produce the protective or barrier structures for an entire eWLB wafer, for example, i.e. multiple semiconductor packages. In comparison with production of the protective structures on already singularized semiconductor packages, this affords an enormous reduction in cost.

Figure 6:
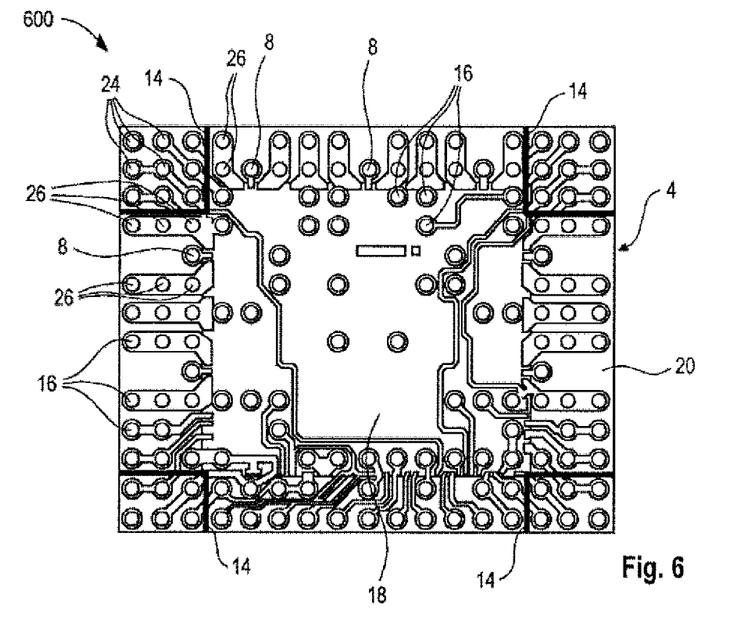
FIG. 6 schematically shows a view of a semiconductor apparatus 600 according to the disclosure from below. The semiconductor apparatus 600 can be regarded as a more detailed implementation of the semiconductor apparatus 200 of FIG. 2. The semiconductor apparatus 600 can be arranged on a circuit board and, in this case, can also be regarded as a more detailed implementation of the semiconductor apparatus 100 of FIG. 1.

FIG. 6 schematically shows a view of a semiconductor apparatus 600 according to the disclosure from below. The semiconductor apparatus 600 can be regarded as a more detailed implementation of the semiconductor apparatus 200 of FIG. 2. The semiconductor apparatus 600 can be arranged on a circuit board and in this case also regarded as a more detailed implementation of the semiconductor apparatus 100 of FIG. 1. The semiconductor apparatus 600 can encompass similar components to the semiconductor apparatus of FIG. 5.

The semiconductor apparatus 600 contains a semiconductor package 4 having a semiconductor chip 18 and a molding material 20 that at least partially encapsulates the semiconductor chip 18. The semiconductor apparatus 600 can be a fan-out wafer-level package. The semiconductor package 4 comprises a multiplicity of connection elements 16 in the form of solder balls, which can be arranged either above a main surface of the semiconductor chip 18 or above a main surface of the molding material 20. In FIG. 6, for the sake of simplicity, only some of the connection elements 16 are provided with a reference sign. Multiple instances of the connection elements 16 are radio-frequency signal connections 8 arranged above a main surface of the molding material 20. In comparison with other connection elements 16 arranged at the periphery of the molding material 20, the radio-frequency signal connections 8 are indented in order to shorten a distance from the semiconductor chip 18 and therefore a length of lines connecting them to the semiconductor chip 18.

Further different types of the connection elements 16 are described by way of example below on the basis of the connection elements 16 arranged in the top left region of the semiconductor apparatus 600. In the corner, there is an example number of nine rectangularly arranged signal connections 24 of the semiconductor package 4 for analog or digital signals, which are arranged above a main surface of the molding material 20. The signal connections 24 are surrounded by a protective structure 14, which can encompass two sections at right angles to one another in the example of FIG. 6. The protective structure 14 is adjoined by multiple ground connections 26 that are arranged above the main surface of the molding material 20 and can each surround one of the radio-frequency signal connections 8 in U-shaped fashion. The protective structure 14 is arranged between the signal connections 24 and the ground connections 26.

The semiconductor apparatus 600 can be arranged above a circuit board (not depicted), as shown by way of example in FIG. 5. In this instance, an underfiller material can be arranged in each of the four corner regions of the main surface 6 of the semiconductor package 4 between the circuit board 2 and the semiconductor package 4. Owing to the arrangement of the protective structures 14, the radio-frequency signal connections 8 in this instance remain not covered by the underfiller material. In a further example, the protective structures 14 can be dispensed with, and other methods should be used to ensure that the underfiller material does not cover the radio-frequency signal connections 8. By way of example, this can be achieved by means of exact metering of the underfiller material. The underfiller material should cover the ground connections 26 at most and leave the radio-frequency signal connections 8 uncovered.

FIG. 7 collectively refers to FIGS. 7A-7D, which schematically show views of semiconductor apparatuses 700A-700D having specific layouts according to the disclosure from below. The semiconductor apparatuses 700A-700D contain underfiller materials having specific layouts. The semiconductor apparatuses 700A-700D can be regarded as more detailed implementations of the semiconductor apparatus 100 of FIG. 1.

Figure 7A:
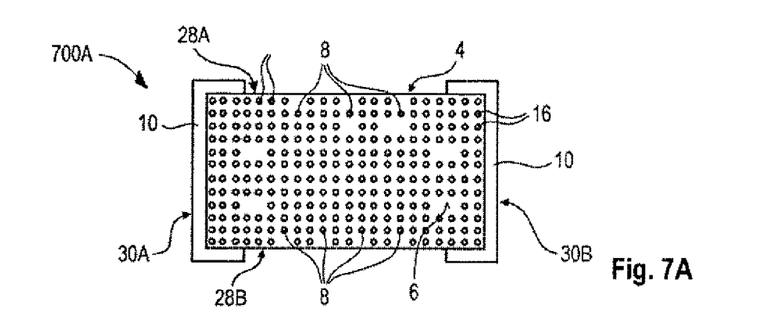

The semiconductor apparatus 700A of FIG. 7A contains a semiconductor package 4 having a main surface 6. Further, the semiconductor apparatus 700A contains multiple connection elements 16, which can be similar to the connection elements 16 described in FIG. 6. By way of example, radio-frequency line elements 8 are arranged at the edge of the main surface 6 and indented in comparison with adjacent connection elements 16. The main surface 6 of the semiconductor package 700A has first opposite sides 28A, 28B having a first side length and second opposite sides 30A, 30B having a second side length, the first side length being greater than the second side length.

The radio-frequency line elements 8 of the semiconductor package 4 are arranged exclusively along the longer first sides 28A, 28B, as a result of which a distance between the radio-frequency line elements 8 and the center of the main surface 6 can be reduced. In the example of FIG. 7A, an example number of three radio-frequency line elements 8 are depicted along the top side 28A and an example number of four radio-frequency line elements 8 are depicted along the bottom side 28B. There are no radio-frequency line elements of the semiconductor package arranged along any of the second shorter sides 30A, 30B of the semiconductor package 4. The connection elements 6 arranged along the shorter sides 30A, 30B can be at an increased interval from the center of the main surface 6. The semiconductor apparatus 700A further encompasses an underfiller material 10 arranged along all of the second shorter sides 30A, 30B. In the example of FIG. 7A, the underfiller material 10 furthermore also encompasses portions along the longer sides 28A, 28B, which means that the underfiller material 10 can form the shape of square parentheses.

In comparison with a semiconductor apparatus having a square main surface, the layout of the semiconductor apparatus 700A affords the possibility of arranging the radio-frequency line elements 8 of the semiconductor package 4 exclusively along the long sides 30A, 30B. The underfiller material 10 can therefore be arranged completely along the short sides 30A, 30B remaining free of radio-frequency line elements 8 and partially along the long sides 28A, 28B. This allows the TCoB performance to be improved in comparison with semiconductor packages having square main surfaces.

Figure 7B:
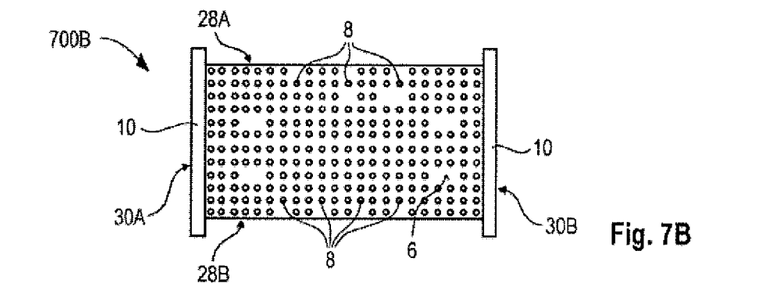

The semiconductor apparatus 700B of FIG. 7B can be similar to the semiconductor apparatus 700A of FIG. 7A, but in comparison therewith encompasses no portions of the underfiller material 10 along the longer sides 28A, 28B of the semiconductor package 4. There is also improved TCoB performance with the semiconductor apparatus 700B.

Figure 7C:
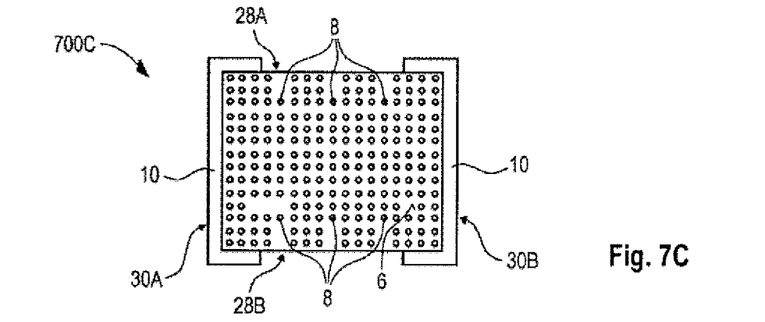

The semiconductor apparatus 700C of FIG. 7C can be similar to the semiconductor apparatus 700A of FIG. 7A. In comparison with FIG. 7A, the longer sides 28A, 28B are somewhat shortened in FIG. 7C. Further, in the example of FIG. 7C, an example number of three radio-frequency line elements 8 are depicted along each of the two longer sides 28A, 28B. There is also improved TCoB performance with the semiconductor apparatus 700B.

Figure 7D:
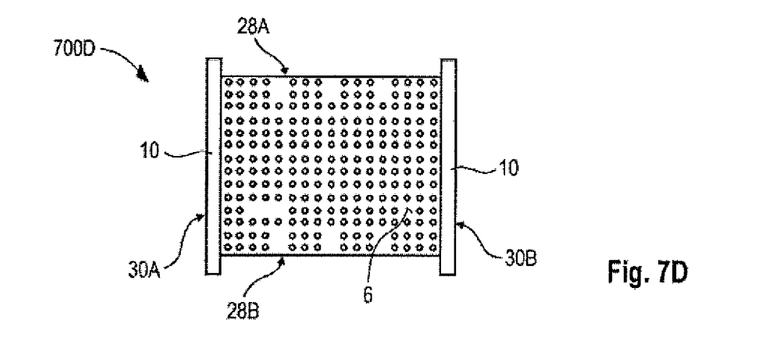

The semiconductor apparatus 700D of FIG. 7D can be similar to the semiconductor apparatus 700C of FIG. 7C, but in comparison therewith encompasses no portions of the underfiller material 10 along the longer sides 28A, 28B of the semiconductor package 4. There is also improved TCoB performance with the semiconductor apparatus 700D.

FIG. 8 collectively refers to FIGS. 8A to 8F, which schematically illustrate cross-sectional views from the side and plan views of a method for manufacturing a semiconductor apparatus 800 according to the disclosure. The method of FIG. 8 can be regarded as a more detailed implementation of the method of FIG. 3. For the sake of simplicity, FIG. 8 does not depict the components used in the method completely, this being indicated by dashed lines in the individual figures. In particular, FIG. 8 always depicts only one corner region of a main surface of a semiconductor package. The steps described in FIG. 8 can also be applied in the further corner regions of the main surface, however.

Figure 8A:
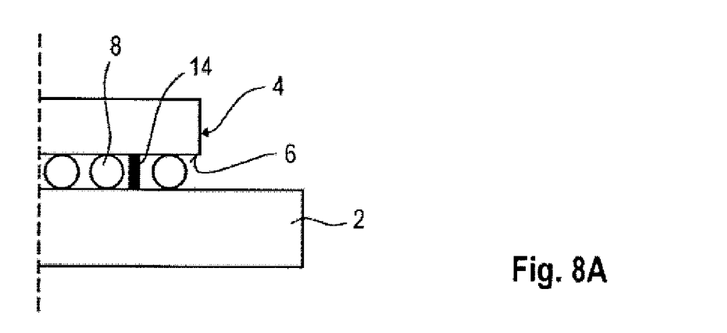
Figure 8B:
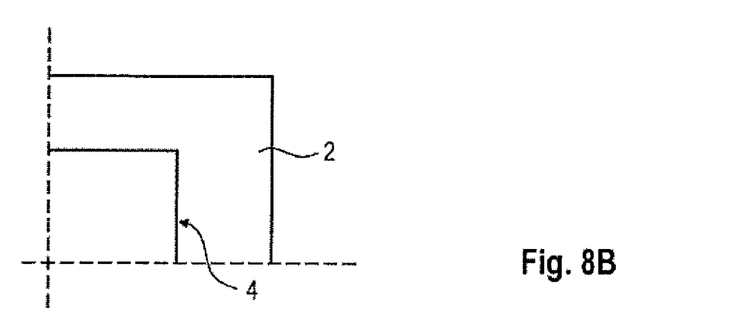

FIGS. 8A and 8B show a cross-sectional view from the side and a plan view, respectively, of a step of the method described. A semiconductor package 4 having a main surface 6 is arranged on a circuit board 2, wherein the main surface 6 faces the circuit board 2. The semiconductor package 4 can be similar to the semiconductor package 4 of FIG. 5, for example, and may contain the same components. In FIG. 8, for the sake of simplicity, a somewhat simplified depiction of the semiconductor package 4 has been chosen, however. The main surface 6 has a radio-frequency line element 8 and a protective structure 14, inter alia, arranged on it.

Figure 8C:
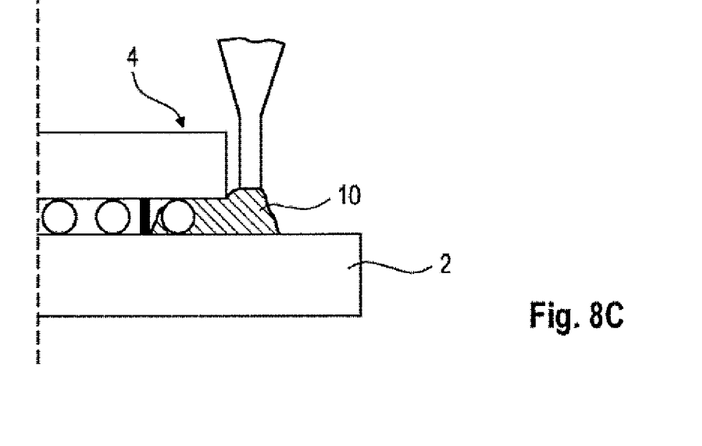
Figure 8D:
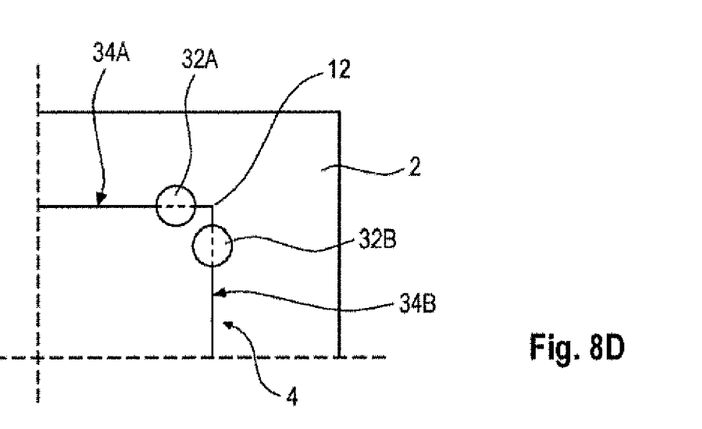

FIGS. 8C and 8D show a cross-sectional view from the side and a plan view, respectively, of a further step of the method described. In this instance, an underfiller material 10 is deposited on the circuit board 2. In the example of FIG. 8, the underfiller material 10 is applied to the circuit board 2 by a needle dispenser. In the example of FIG. 8, a first droplet 32A of the underfiller material 10 can be dispensed on the circuit board 2 on a first side 34A adjoining the corner 12 of the semiconductor package 4. Further, a second droplet 32B of the underfiller material 10 can be dispensed on the circuit board 2 on a second side 34B adjoining the corner 12 of the semiconductor package 4. In a further example, only a single droplet can be dispensed on the corner 12 of the semiconductor package 4. In yet further examples, it is also possible for more than two droplets to be dispensed on the sides 34A, 34B. It is clear that the number of droplets applied can be dependent on the desired shape of the underfiller material 10 that is later cured.

Figure 8E:
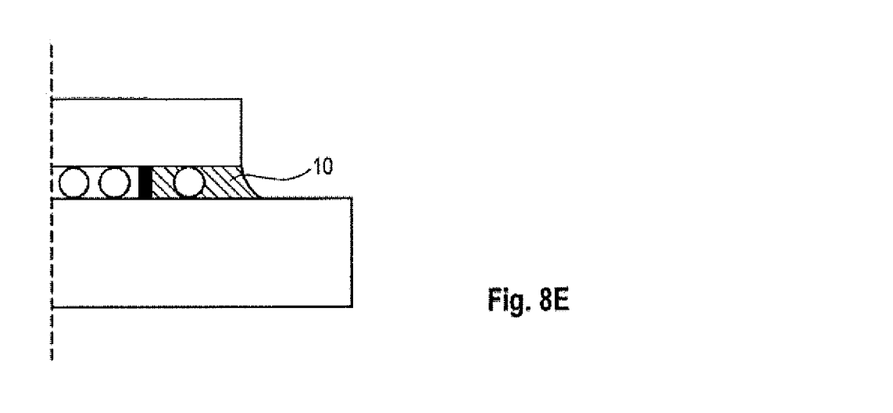
Figure 8F:
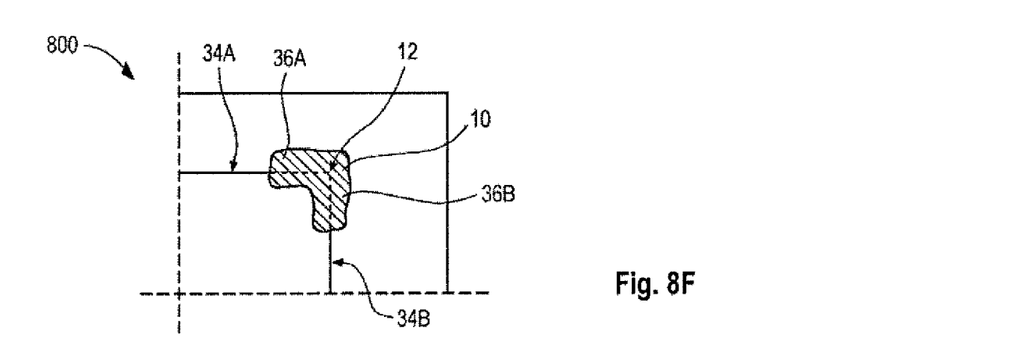

FIGS. 8E and 8F show a cross-sectional view from the side and a plan view, respectively, of a further step of the method described. Following its application, the underfiller material 10 spreads out beneath the main surface 6 of the semiconductor package 4 on account of acting capillary forces. In this instance, the underfiller material 10 can be stopped by the protective structure 14, which means that the radio-frequency line element 8 remains not covered by the underfiller material 10. The droplets 30A, 30B can run into one another, as a result of which the underfiller material 10 can form two portions 36A, 36B that are substantially at right angles to one another and that can cover the lateral edges of the semiconductor package that adjoin the corner 12 of the semiconductor package 4.

Figure 10:
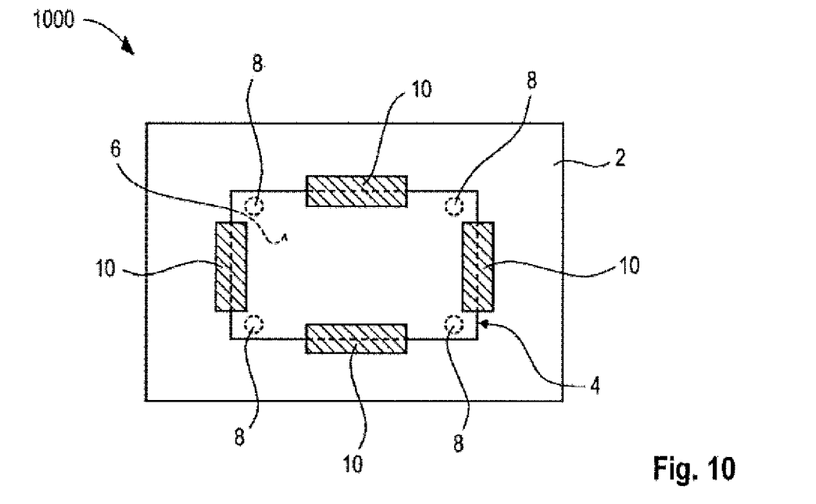
FIG. 10 schematically shows a cross-sectional side view of a semiconductor apparatus 1000 according to the disclosure. The semiconductor apparatus 1000 contains a semiconductor package arranged on a circuit board, underfiller material being arranged along the lateral edges of the semiconductor package.

FIG. 10 schematically shows a plan view of a semiconductor apparatus 1000 according to the disclosure. By way of example, the semiconductor apparatus 1000 can be manufactured using the method of FIG. 8. The semiconductor apparatus 1000 contains a semiconductor package 4 arranged on a circuit board 2, wherein a main surface 6 of the semiconductor package 4 faces the circuit board 2. An underfiller material 10 and radio-frequency line elements 8 are arranged between the circuit board 2 and the main surface 6 of the semiconductor package 4. In contrast to some preceding examples, the radio-frequency line elements 8 are arranged not along the lateral edges of the semiconductor package 4 but rather in corner regions of the main surface 6. Further, in contrast to some preceding examples, the underfiller material 10 is arranged not in corner regions of the main surface 6 but rather along the lateral edges of the semiconductor package 4. In the example of FIG. 10, the underfiller material 10 is arranged in the central region of the respective lateral edge. Analogously to preceding examples, the radio-frequency line elements 8 and the underfiller material 10 do not overlap in an orthogonal projection onto the main surface 6 of the semiconductor package 4. The radio-frequency line elements 8 are not covered by the underfiller material 10. In the example of FIG. 10, by way of example four radio-frequency elements 8 are arranged in the corner regions of the main surface of the semiconductor package 4. The semiconductor apparatus 1000 can also encompass further radio-frequency line elements (e.g. radio-frequency signal connections, radio-frequency signal lines, etc.) that likewise do not overlap the underfiller material 10 in an orthogonal projection onto the main surface 6.

Within the meaning of the present description, the terms "connected", "coupled", "electrically connected" and/or "electrically coupled" need not necessarily mean that components must be directly connected or coupled to one another. Intervening components can be present between the "connected", "coupled", "electrically connected" or "electrically coupled" components.

Further, the word "above" used for example with respect to a material layer that is formed "above" a surface of an object or is situated "above" said surface can be used in the present description in the sense that the material layer is arranged (for example formed, deposited, etc.) "directly on", for example in direct contact with, the surface that is meant. The word "above" used for example with respect to a material layer that is formed or arranged "above" a surface can also be used in the present text in the sense that the material layer is arranged (e.g. formed, deposited, etc.) "indirectly on" the surface that is meant, wherein for example one or more additional layers are situated between the surface that is meant and the material layer.

Insofar as the terms "have", "contain", "encompass", "with" or variants thereof are used either in the detailed description or in the claims, these terms are intended to be inclusive in a similar manner to the term "comprise". That means that within the meaning of the present description the terms "have", "contain", "encompass", "with", "comprise" and the like are open terms that indicate the presence of stated elements or features but do not exclude further elements or features. The articles "a/an" and "the" should be understood such that they include the plural meaning and also the singular meaning, unless the context clearly suggests a different understanding.

Furthermore, the word "example" is used in the present text in the sense that it serves as an example, a case or an illustration. An aspect or a design that is described as "example" in the present case should not necessarily be understood in the sense as though it has advantages over other aspects or designs. Rather, the use of the word "example" is intended to present concepts in a concrete manner. Within the meaning of this application, the term "or" does not mean an exclusive "or", but rather an inclusive "or". That is to say that, unless indicated otherwise or unless a different interpretation is allowed by the context, "X uses A or B" means each of the natural inclusive permutations. That is to say that if X uses A, X uses B or X uses both A and B, then "X uses A or B" is fulfilled in each of the cases mentioned above. Moreover, the articles "a/an" can be interpreted within the meaning of this application and the accompanying claims generally as "one or more", unless it is expressly stated or clearly evident from the context that only a singular is meant. Furthermore, at least one from A and B or the like generally means A or B or both A and B.

Apparatuses and methods for manufacturing apparatuses are described in the present text. Observations made in connection with a described apparatus can also apply to a corresponding method, and vice versa. If a specific component of an apparatus is described, for example, then a corresponding method for manufacturing the apparatus can contain a process for providing the component in a suitable manner, even if such a process is not explicitly described or illustrated in the figures. Moreover, the features of the various example aspects described in the present text can be combined with one another, unless expressly noted otherwise.

Although the disclosure has been shown and described with respect to one or more implementations, equivalent alterations and modifications based at least in part on the reading and understanding of this description and the accompanying drawings will be apparent to a person skilled in the art. The disclosure includes all such modifications and alterations and is restricted solely by the concept of the claims that follow. Especially with respect to the various functions that are implemented by the above-described components (for example elements, resources, etc.), the intention is that, unless indicated otherwise, the terms used for describing such components correspond to any components that implement the specified function of the described component (which is functionally equivalent, for example), even if it is not structurally equivalent to the disclosed structure that performs the function of the example implementations of the disclosure as presented herein. Furthermore, even if a specific feature of the disclosure has been disclosed with respect to only one of various implementations, such a feature can be combined with one or more other features of the other implementations in a manner such as is desired and advantageous for a given or specific application.

What is claimed is:

1. A semiconductor apparatus, comprising:
   a circuit board;
   a semiconductor package arranged on the circuit board and having a main surface facing the circuit board,
      wherein the semiconductor package comprises a radio-frequency line element arranged on the main surface of the semiconductor package, and
      wherein the semiconductor package comprises a microwave-integrated circuit connected to the radio-frequency line element,
         wherein the microwave-integrated circuit is configured to operate in a frequency range greater than 10 GHz,
         wherein the microwave-integrated circuit comprises at least one of a microwave transmitter, a microwave transceiver, or a microwave detector, and
         wherein the radio-frequency line element is configured to transmit a signal at the frequency range greater than 10 GHz; and
   an underfiller material arranged, between the circuit board and the semiconductor package, wherein the underfiller material is on the main surface of the semiconductor package,
      wherein the radio-frequency line element and the underfiller material do not overlap in an orthogonal projection provided onto the main surface of the semiconductor package.

2. The semiconductor apparatus as claimed in claim 1, wherein the radio-frequency line element is a radio-frequency signal connection configured to transmit the signal at the frequency range greater than 10 GHz to the circuit board.

3. The semiconductor apparatus as claimed in claim 1, wherein the semiconductor package further comprises:

a semiconductor chip having a second main surface, and
a molding material having a third main surface,
wherein the second main surface of the semiconductor chip and the third main surface of the molding material form the main surface of the semiconductor package in a coplanar fashion, and
wherein the radio-frequency line element is arranged above the third main surface of the molding material.

4. The semiconductor apparatus as claimed in claim 1, wherein the semiconductor package further comprises a signal connection for one or more analog or digital signals, and
wherein the signal connection is arranged in a corner region of the main surface of the semiconductor package and is covered by the underfiller material.

5. The semiconductor apparatus as claimed in claim 4, wherein the semiconductor package further comprises a ground connection arranged on the main surface of the semiconductor package between the signal connection and the radio-frequency line element.

6. The semiconductor apparatus as claimed in claim 5, wherein the ground connection is covered by the underfiller material.

7. The semiconductor apparatus as claimed in claim 1, wherein the underfiller material encompasses two portions, at right angles to one another, covering lateral edges of the semiconductor package that adjoin a corner region of the semiconductor package.

8. The semiconductor apparatus as claimed in claim 5, further comprising:
a protective structure arranged between the radio-frequency line element and the underfiller material,
wherein the underfiller material makes contact with the protective structure.

9. The semiconductor apparatus as claimed in claim 8, wherein the protective structure is arranged between the signal connection and the ground connection.

10. The semiconductor apparatus as claimed in claim 8, wherein the protective structure is formed by multiple solder balls that have flowed into one another
wherein the solder balls are arranged on multiple interconnected contact pads of the circuit board.

11. The semiconductor apparatus as claimed in claim 1, wherein the main surface of the semiconductor package has first opposing sides, having a first side length, and second opposing sides having a second side length,
wherein the first side length is greater than the second side length,
wherein the radio-frequency line element is arranged on one of the first opposing sides,
wherein there is no radio-frequency line element of the semiconductor package arranged along any of the second opposing sides, and
wherein the underfiller material is arranged along all of the second opposing sides.

12. The semiconductor apparatus as claimed in claim 1, further comprising:
a radio-frequency signal line, arranged on the circuit board or on the main surface of the semiconductor package, that is electrically connected to the radio-frequency line element and is not covered by the underfiller material.

13. The semiconductor apparatus as claimed in claim 1, wherein a modulus of elasticity of the underfiller material has a value of greater than 8 GPa.

14. The semiconductor apparatus as claimed in claim 1, wherein the underfiller material is arranged in a corner region, or in an edge region, of the main surface of the semiconductor package between the circuit board and the semiconductor package.

15. The semiconductor apparatus as claimed in claim 1, further comprising:
further underfiller material arranged outside a corner region of the main surface of the semiconductor package between the circuit board and the semiconductor package,
wherein the radio-frequency line element and the further underfiller material do not overlap in the orthogonal projection provided onto the main surface of the semiconductor package.

16. The semiconductor apparatus as claimed in claim 1, wherein the radio-frequency line element is not covered by the underfiller material.

17. A semiconductor apparatus, comprising:
a semiconductor package comprising a radio-frequency line element arranged on a main surface of the semiconductor package,
wherein the semiconductor package comprises a microwave-integrated circuit connected to the radio-frequency line element,
wherein the microwave-integrated circuit is configured to operate in a frequency range greater than 10 GHz,
wherein the microwave-integrated circuit comprises at least one of microwave transmitters, microwave transceivers, microwave sensors, or microwave detectors; and
a protective structure arranged on the main surface of the semiconductor package, and
wherein the protective structure and a region of the main surface, of the semiconductor package, that is covered by an underfiller material between the main surface and a circuit board when the semiconductor package is arranged on the circuit board and that does not overlap in an orthogonal projection provided onto the main surface of the semiconductor package.

18. A method for manufacturing a semiconductor apparatus, comprising:
arranging a semiconductor package onto a circuit board;
wherein the semiconductor package comprises a radio-frequency line element arranged on a main surface of the semiconductor package,
wherein the semiconductor package comprises a microwave-integrated circuit connected to the radio-frequency line element,
wherein the microwave-integrated circuit is configured to operate in a frequency range greater than 10 GHz,
wherein the microwave-integrated circuit comprises at least one of a microwave transmitter, a microwave transceiver, a microwave sensor, or a microwave detector, and
wherein the radio-frequency line element is configured to transmit a signal at the frequency range greater than 10 GHz; and
depositing an underfiller material onto the circuit board,
wherein the main surface of the semiconductor package faces the circuit board,
wherein the underfiller material is arranged between the circuit board and the semiconductor package,
wherein the underfiller material is on the main surface of the semiconductor package, and wherein the radio-frequency line element and the underfiller material do not overlap in an orthogonal projection provided onto the main surface of the semiconductor package.

19. The method as claimed in claim 18, wherein depositing the underfiller material comprises:
dispensing a first droplet of the underfiller material on the circuit board; and
dispensing a second droplet of the underfiller material on the circuit board,
wherein the first droplet and the second droplet run into one another to cause the underfiller material to form two portions at right angles to one another.

20. The method as claimed in claim 18, wherein the radio-frequency line element is a radio-frequency signal connection configured to transmit the signal at the frequency of greater than 10 GHz to the circuit board.

* * * * *